United States Patent
Zhang et al.

(10) Patent No.: US 6,225,800 B1
(45) Date of Patent: May 1, 2001

(54) ARRANGEMENT FOR COUPLING AN RF-SQUID MAGNETOMETER TO A SUPERCONDUCTIVE TANK CIRCUIT

(75) Inventors: Yi Zhang, Jülich; Jürgen Schubert, Elsdorf; Willi Zander, Aldenhoven; Helmut Soltner, Inden; Marko Banzet, Jülich, all of (DE)

(73) Assignee: Forschungszentrum Jülich GmbH, Jülich (DE)

( * ) Notice: Subject to any disclaimer, the term of this patent is extended or adjusted under 35 U.S.C. 154(b) by 0 days.

(21) Appl. No.: 09/155,342

(22) PCT Filed: Mar. 18, 1997

(86) PCT No.: PCT/DE97/00552

§ 371 Date: Sep. 25, 1998

§ 102(e) Date: Sep. 25, 1998

(87) PCT Pub. No.: WO97/36186

PCT Pub. Date: Oct. 2, 1997

(30) Foreign Application Priority Data

Mar. 26, 1996 (DE) ................................. 196 11 900
Nov. 28, 1996 (DE) ........................... 296 20 718 U

(51) Int. Cl.$^7$ .......................... G01R 33/035; H01L 39/22
(52) U.S. Cl. .................... 324/248; 505/846; 257/34; 327/527
(58) Field of Search ................. 324/248; 257/31, 257/32, 34, 661, 663; 327/510, 527; 505/845, 846, 876

(56) References Cited

U.S. PATENT DOCUMENTS 5,326,986   7/1994   Miller, Jr. .
5,465,049   11/1995  Matsuura .

FOREIGN PATENT DOCUMENTS

| 40 03 524 A1 | 8/1991 | (DE) . |
| 44 36 448 C1 | 2/1996 | (DE) . |
| 44 33 331 A1 | 3/1996 | (DE) . |
| 0 246 419 | 11/1987 | (EP) . |
| 0 441 281 A2 | 8/1991 | (EP) . |

OTHER PUBLICATIONS

Y. Zhang, et al. "High–sensitivity microwave RF SQUID operating at 77K", Superconductor Science and Technology, No. 5, May 1994, pp. 269–272.

J.Z. Sun, et al., "Direct–Coupled High–$T_c$ Thin Film Squids Using Step–Edge Weak–Link Junctions", Applied Superconductivity, vol. 3, No. 7–10, pp. 425–441, 1995.

F. Ludwig, et al. "Multilayer Magnetometers Based on High–$T_c$ Squids", Applied Superconductivity, vol. 3, No. 7–10, pp. 383–398, 1995.

Y. Zhang, et al. "HTS rf SQUIDS with Fully Integrated Planar Tank Circuits", IEEE Transactions on Applied Superconductivity, vol. 7, No. 2, Jun. 1997, pp. 2870–2873.

T.D. Clark, et al, "Josephson–Effekt misst schwächste Magnetfelder", Elektrotechnik, 65, H. 7, Apr. 1983, pp. 24–27 (no translation).

*Primary Examiner*—Walter E. Snow
(74) *Attorney, Agent, or Firm*—Collard & Roe, PC

(57) ABSTRACT

An arrangement for coupling an rf-SQUID magnetometer to a superconductive tank circuit on a substrate is constructed in such a way that the two components are fully integrated into each other. Such integration increases the quality of the tank circuit by a factor of 2 to 3 as opposed to an arrangement obtainable by the flip-chip technology. Furthermore, the integrated arrangement permits simple assessment of coupling "k" between the SQUID and the tank circuit.

10 Claims, 8 Drawing Sheets

ARRANGEMENT FOR COUPLING AN RF-SQUID MAGNETOMETER TO A SUPERCONDUCTIVE TANK CIRCUIT

The present invention relates to an arrangement for coupling an rf-SQUID magnetometer to a superconductive tank oscillating circuit and to a base plate.

Various proposals have been pursued heretofore for coupling rf-SQUID magnetometers to superconductive tank oscillating circuits.

Y. Zhang et al in "High-sensitivity microwave RF squid operating at 77 K", SUPERCONDUCTOR SCIENCE AND TECHNOLOGY, vol. 7, No. 5, May 1, 1994, pages 269–272, XP000442664, teaches to employ a λ-resonator or λ/2-resonator, to which an rf-SQUID is coupled galvanically and at the same time functioning as a flow pivkup loop. Such a SQUID-magnetometer may have a tank frequency of 3 GHz.

The use of a λ-resonator, however, poses problems it has a low quality of just a few 100. This represents a rather low quantity in view of qualities of a few 1000 reached already with λ/2-resonators. Furthermore, the fact that galvanic coupling makes it necessary to take into account a parameter that is difficult to calculate, namely high-frequency current distribution, leads to considerable problems. High-frequency current distribution represents a quantity which is not easy to calculate or to control experimentally. Therefore, the SQUID-layout is difficult to optimize.

It is known from DE 44 36 448 to produce planar LC-oscillating circuits from thin YBaCuO-layers with high frequency and high quality. Such LC-oscillating circuits are operated in a flip-chip arrangement with the rf-SQUID in washer-SQUID structure. The parasitic capacities occurring in this connection between the LC-oscillating circuit and the rf-SQUID reduce the quality of the LC-oscillating circuit and make the current distribution in the combined LC-oscillating circuit structure/washer-SQUID structure complicated.

Therefore, the problem of the present invention is to create an arrangement which eliminates the aforementioned problems when an rf-SQUID magnetometer is coupled to a superconductive oscillating circuit.

The problem is solved in that the tank circuit and the rf-SQUID magnetometer are housed planar to each other on the same substrate, the tank circuit having a tank circuit coil and a laminar capacitative structure which enclose the rf-SQUID magnetometer.

The arrangement as defined by the invention relates to the possibility of advantageously and optimally coupling an rf-SQUID magnetometer to a tank circuit without the problems specified above. As opposed to the aforementioned flip-chip solution of the state of the art, the quality of the oscillating circuit is increased with the fully integrated arragement of the SQUID-magnetometer and the tank circuit even by factor 2 or 3, for example to a quality of Q=6000 at a resonance frequency of $f_o$=580 MHz. One reason for such increase is that in the arrangement as defined by the invention, high-frequency radiation is reduced on account of the SQUID.

Furthermore, the fully integrated arrangement permits simple estimation of coupling "k" between the rf-SQUID and the tank circuit.

It is advantageous if the tank circuit consists of superconducting thin-layered material, thereby optimizing the characteristics of the arrangement of the invention.

It is particularly advantageous if the circuit coil of the tank circuit is designed as an inner loop enclosing the rf-SQUID magnetometer and having a slot. It is also especially advantageous if also the base plate is designed as an outer loop with slot and coplanar with the rf-SQUID magnetometer and the tank circuit because noise caused by the base plate can be suppressed in this way.

Furthermore, it is particularly advantageous that the orientation of the slots of the inner and outer loops relative to each other determines the resonance frequency. It is possible in this way to manufacture a multi-channel HTSL-SQUID system at favorable cost, for example for medical applications.

Embodiments of the present invention are described in greater detail in the following with the help of the drawings, in which:

FIG. 8 is a diagram of a test measurement with a geometry according to FIG. 7a.

Figure 1:
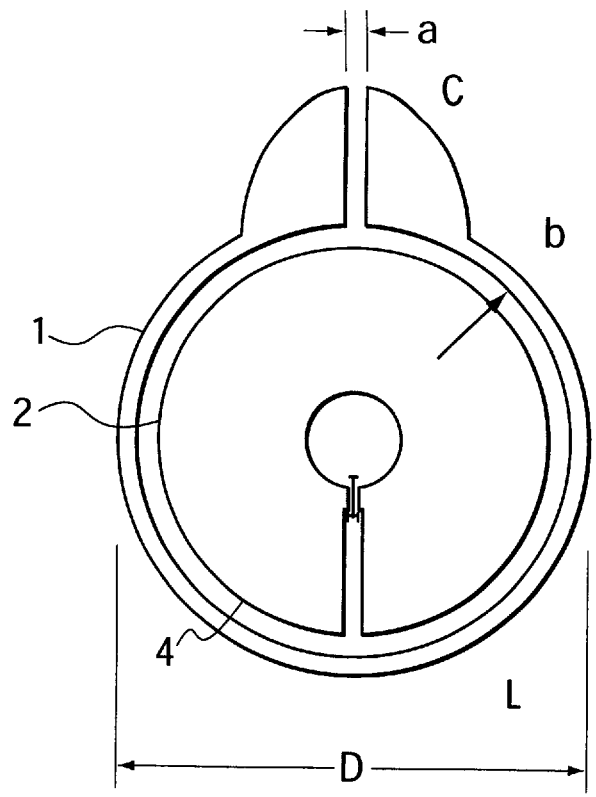
FIG. 1 is a schematic top view of an rf-SQUID and tank circuit in the arrangement as defined by the invention.

FIG. 1 shows a schematic draft for an integrated arrangement as defined by the invention, comprising a tank circuit 1 with an rf-SQUID 2. Table 1 shows the measured results with respect to the oscillating circuit parameters with and without integrated rf-SQUID structure. Unless stated otherwise the measurements relate to the following:
a=0.2 mm, b=0.5 mm, D=22 mm, Δ=0.15 mm, s=0.1 mm.

Table 1 shows that the characteristic parameters of tank circuit 1 are substantially determined by the outside diameter D and to a lesser degree also by spacing "b" of capacitor "C". The inductivity increases when width "L" is reduced.

TABLE 1

|  | 1 | 2 | 3 | 4 | 5 | 6 |
|---|---|---|---|---|---|---|
| $f_o$ MHz | / | 480 | 511.2 | 500 | 550 | 520 | 800 |
| $Q_o$ |  | 2400 | 5900 | 6300 | 5500 | 4000 | 3500 |

Figure 2:
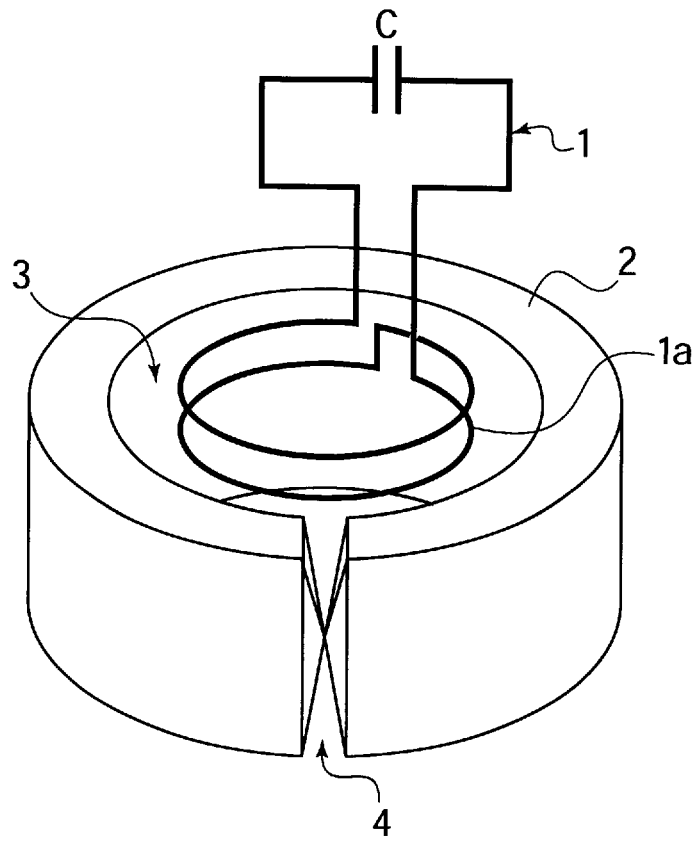
FIG. 2 is a schematic perspective view of a bulk-rf-SQUID with a tank circuit disposed on the inside according to an arrangement of the state of the art.

The following conditions apply to measurements 1 to 6:
(1) $f_o$=480, $Q_o$=2400
(2) Full circuit without SQUID-structure
(3) with SQUID-structure
(4) a=0.4 mm
(5) b=0.2 mm
(6) D=15 mm The operating arrangement for a bulk-rf-SQUID is tested for a simple analysis of the coupling between rf-SQUID 1 and tank circuit 2 (FIG. 2). A weak link is formed by mechanically working, for example a superconductive bulk cylinder. Together with the rest of the cylinder this produces an rf-SQUID 2 with a SQUID loop 3, which is excited with the help of a wound tank circuit coil 1a, which is inserted in SQUID loop 3. The material of tank circuit coil 1 usually consists of copper.

Figure 3:
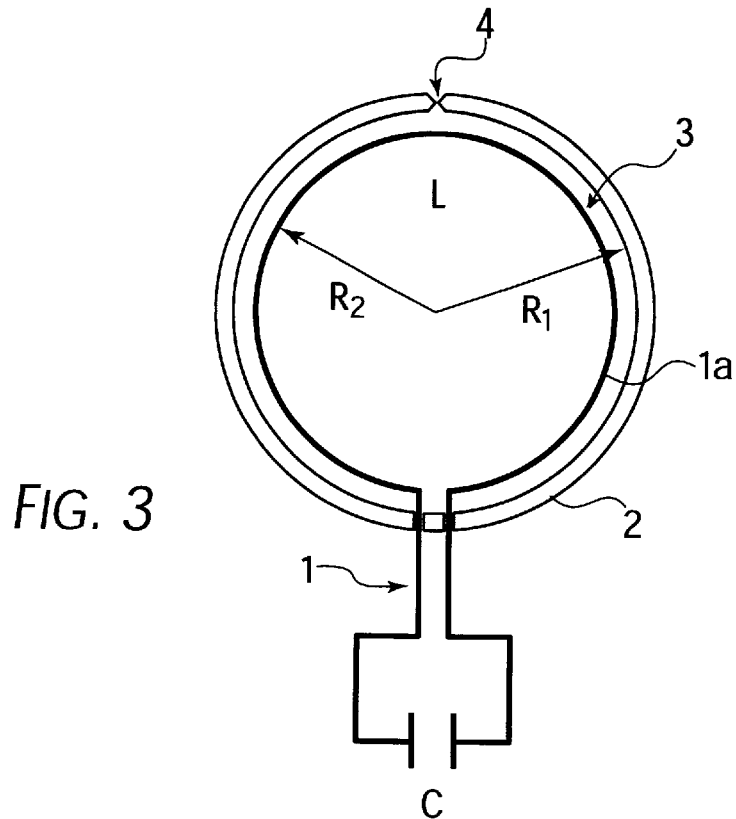
FIG. 3 is a schematic top view of the bulk-rf-SQUID shown in FIG. 2.

Coupling $k^2$ can be estimated with this arrangement in a simple way. It is given by $k^2=S_c/S_L$, $S_c$ indicating the area of tank circuit coil 1 (=$\pi \cdot R_1^2$) and $S_L$ (=$\pi \cdot R_2^2$) indicating the area of SQUID loop 3 (see FIG. 3). (However, $k^2$ practically becomes<$S_c/S_L$ because the length of tank circuit coil 1 has a finite value and a slot 4 of SQUID 1 has a width different from zero).

Figure 4:
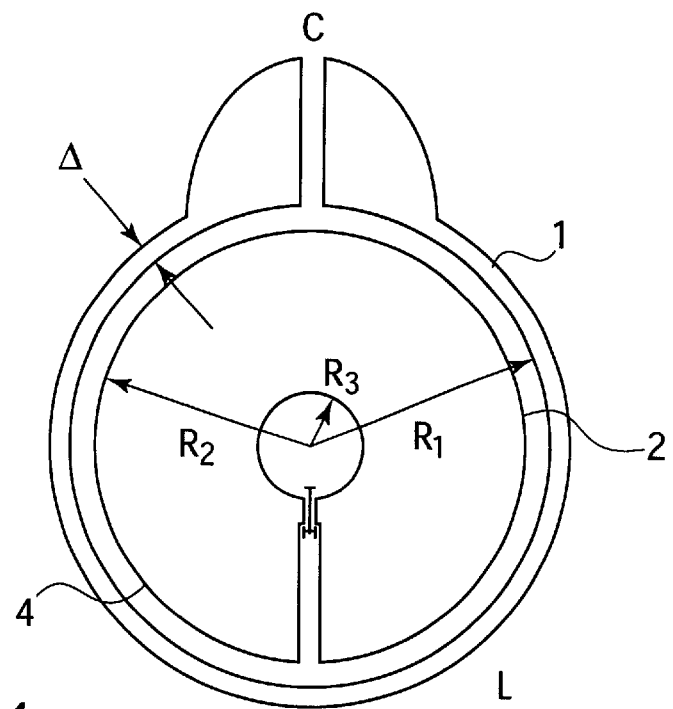
FIG. 4 is a schematic top view of another embodiment of an rf-SQUID as shown in FIG. 1, with additional dimensional data.

In the top view (FIG. 3), the arrangement of the bulk-rf-SQUID 2 looks similar to the draft as defined by the invention in FIG. 1. The arrangement in FIG. 1 differs from the one in FIG. 2 or FIG. 3 in that the tank circuit coil 1a encloses rf-SQUID 2 (see also FIG. 4). A geometric view supplies for the coupling the value $k^2$ which results from the ratio of the effective areas $S_e$ of SQUID loop 3 and area $S_c$ of tank circuit coil 1a:

$$k^2=S_e/S_c \approx \alpha \cdot R_2 \cdot R_3/(\pi \cdot R_1^2)=\alpha \cdot R_3/R_1.$$

The last estimate applies because of $R_1 \approx R_2$, with the value of alpha being between 0.5 and 1.

Figure 5A:
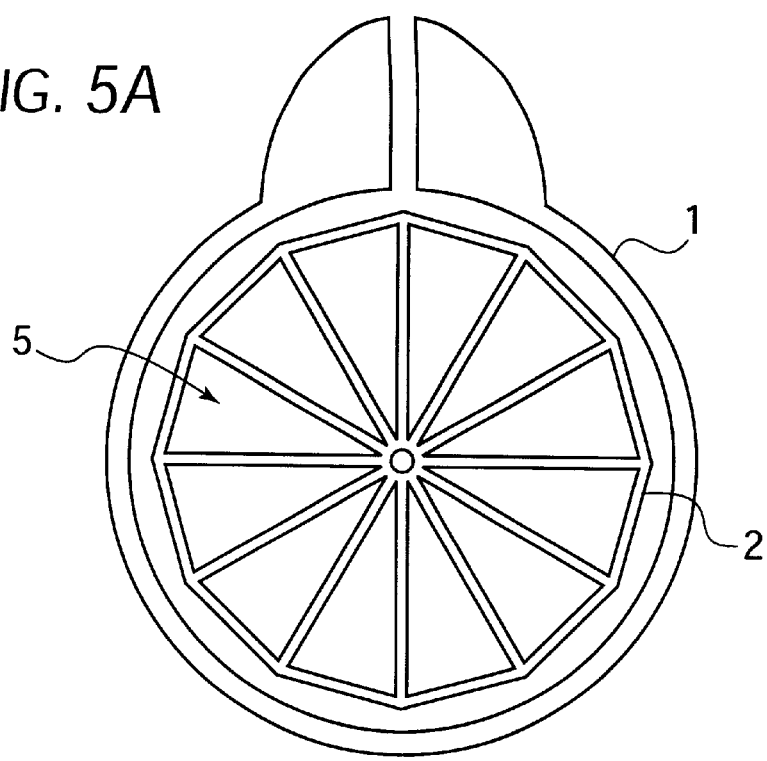
FIG. 5a is a schematic top view of yet another embodiment with a multi-loop SQUID structure.
Figure 5B:
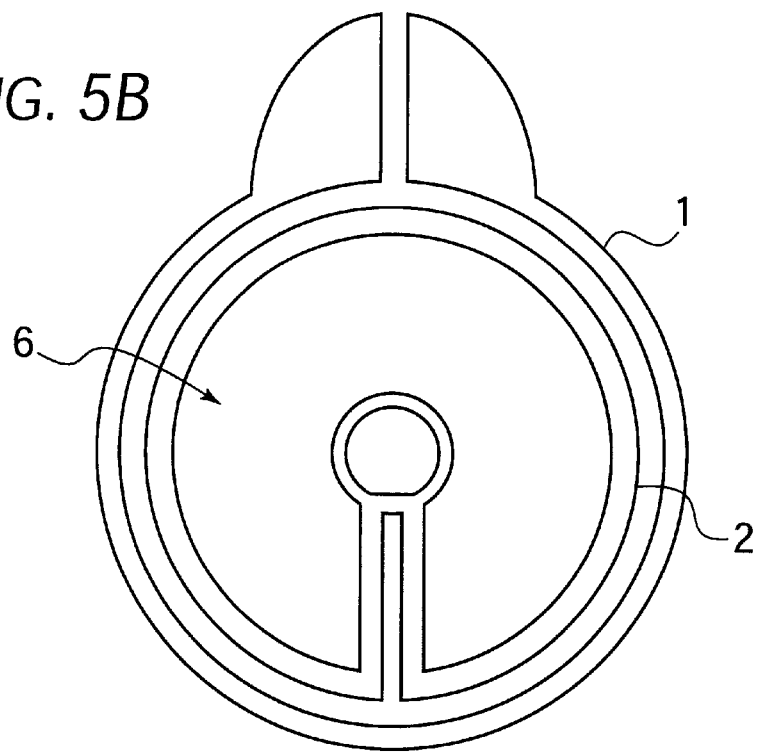
FIG. 5b is a schematic top view of another embodiment with a current-injection SQUID structure.
Figure 5C:
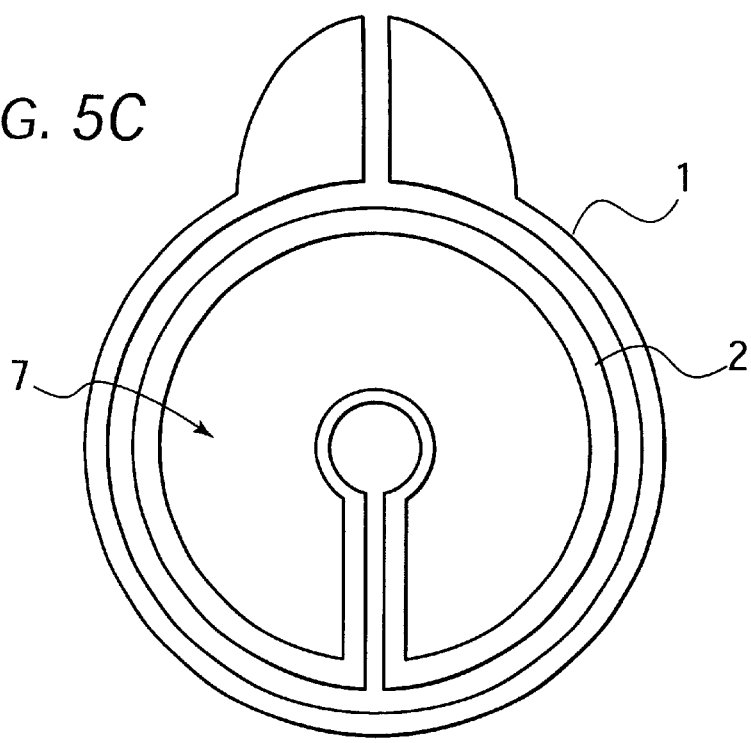
FIG. 5c is a schematic top view of another embodiment with a single-layer transformer.
Figure 5D:
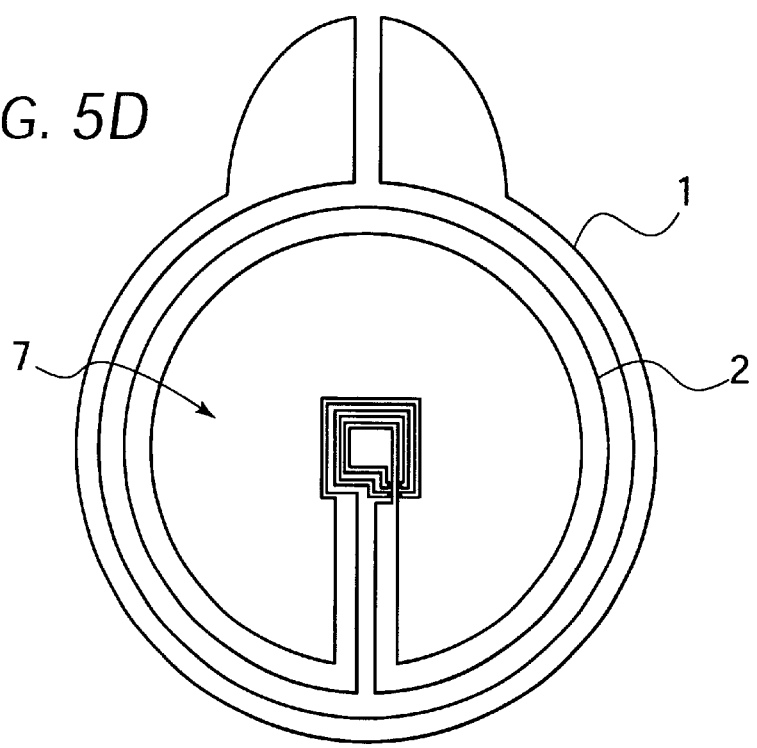
FIG. 5d is a schematic top view of another embodiment with a multilayer transformer with a plurality of windings.

The integrated arrangement as defined by the invention offers the possibility of using many different SQUID-structures, including the washer-SQUID structures already described and multi-loop structures 5 according to Drung (FIG. 5a). In flip-chip technology it is possible to use single-layer (FIG. 5c) or multi-layer transformers 7 with several windings instead of the washer-structure (FIG. 5d).

Figure 5E:
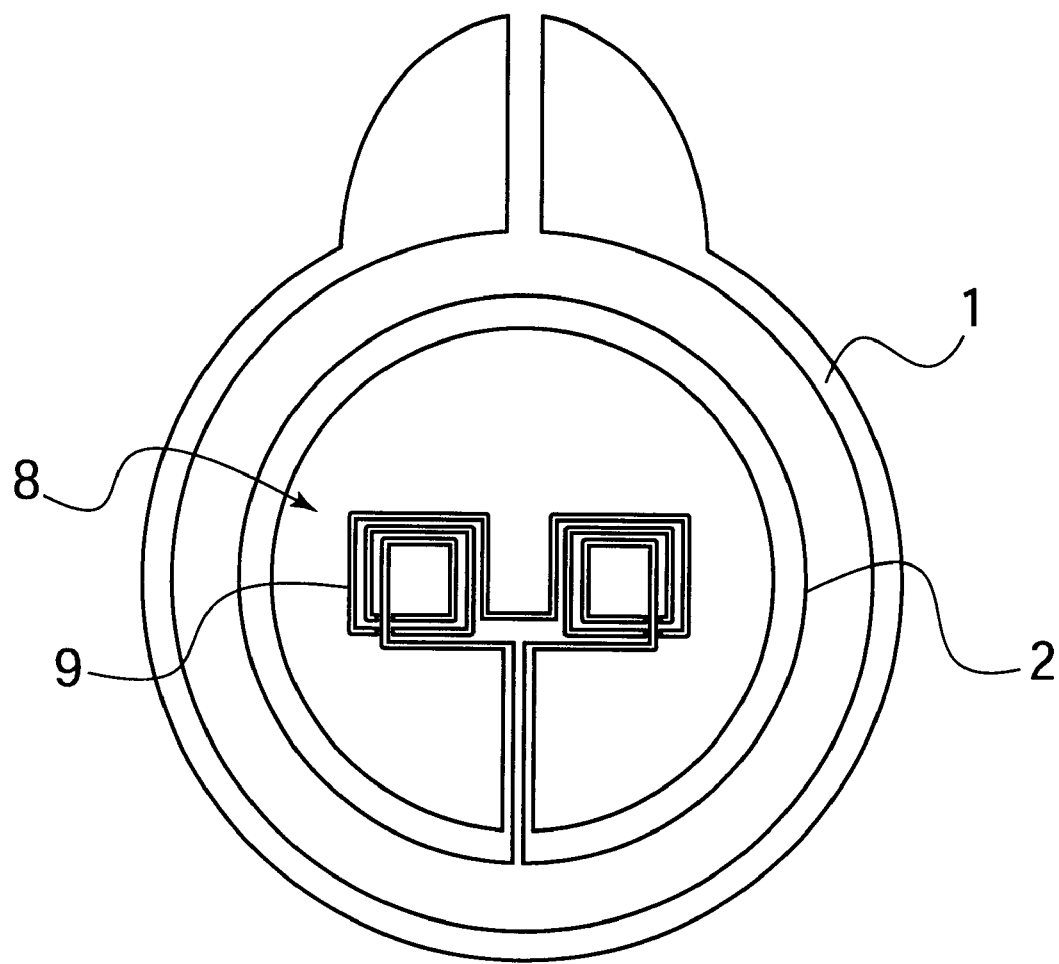
FIG. 5e is a schematic top view of another embodiment with a twin-coil gradiometer.

Another possibility is available by using a twin-coil gradiometer 8 in flip-chip technology. The SQUID-inductivity is reduced in this connection by factor 2. Use is made in this connection of an arrangement with two oppositely oriented coils 9 connected in series (FIG. 5e). The coupling factor between twin coil 9 and the twin-coil gradiometer is increased in this connection and a highly sensitive magnetometer is obtained in this way.

The capacitive range of oscillating circuit 1 is also capacitively coupled to a 50 ohm-line (not shown) to the electronics, which is at room temperature.

The first tests with an rf-SQUID 2 with a 6·6 mm² washer and a 20 μm·20 μm loop in flip-chip technology on a single-layer flow transformer were carried out successfully. The coupling can be estimated in this case with α=0.5 and $R_3$=10 μm and $R_1$=10 mm to come to $k^2$=1/2000. So as to satisfy the condition $k^2 \cdot Q$ the value for the quality of the oscillating circuit should exceed 2000. A complete SQUID-signal was observed. This supports the correctness of our above sstimation of $k^2$. The white flow noise $S_{rp}^{1/2}$ was determined to come to smaller than $7 \cdot 10^{-6}$ $\phi_o/\sqrt{Hz}$ at 77 K. The properties of the oscillating circuit are stated in table 1. $k^2 \cdot Q > 1$ can be determined.

rf-SQUID magnetometers 2 with planar oscillating circuits and λ/2- or λ-resonators require a base plate 10 made from metal or superconductive material, with the result that tank circuit 1 with integrated SQUID 2 and the base plate 10 cannot be arranged in one plane. Furthermore, base plate 10 represents a possible noise source which may limit the use of an rf-SQUID magnetometer 2.

Said problem was solved in connection with the present invention by realizing the following points:
(1) Base plate 10 is replaced by a coplanar arrangement in the form of an outer loop 10a, so that tank circuit 1, SQUID 2 and base plate 10 can be arranged in one plane.
(2) A change in the tank frequency of the rf-SQUID 2 was achieved by a simple change in the geometry of the coplanar oscillating circuit 10a. This is a substantial advantage over the current state of the art especially in view of the structure of a multi-channel SQUID system, for example for medical applications.

Figure 6:
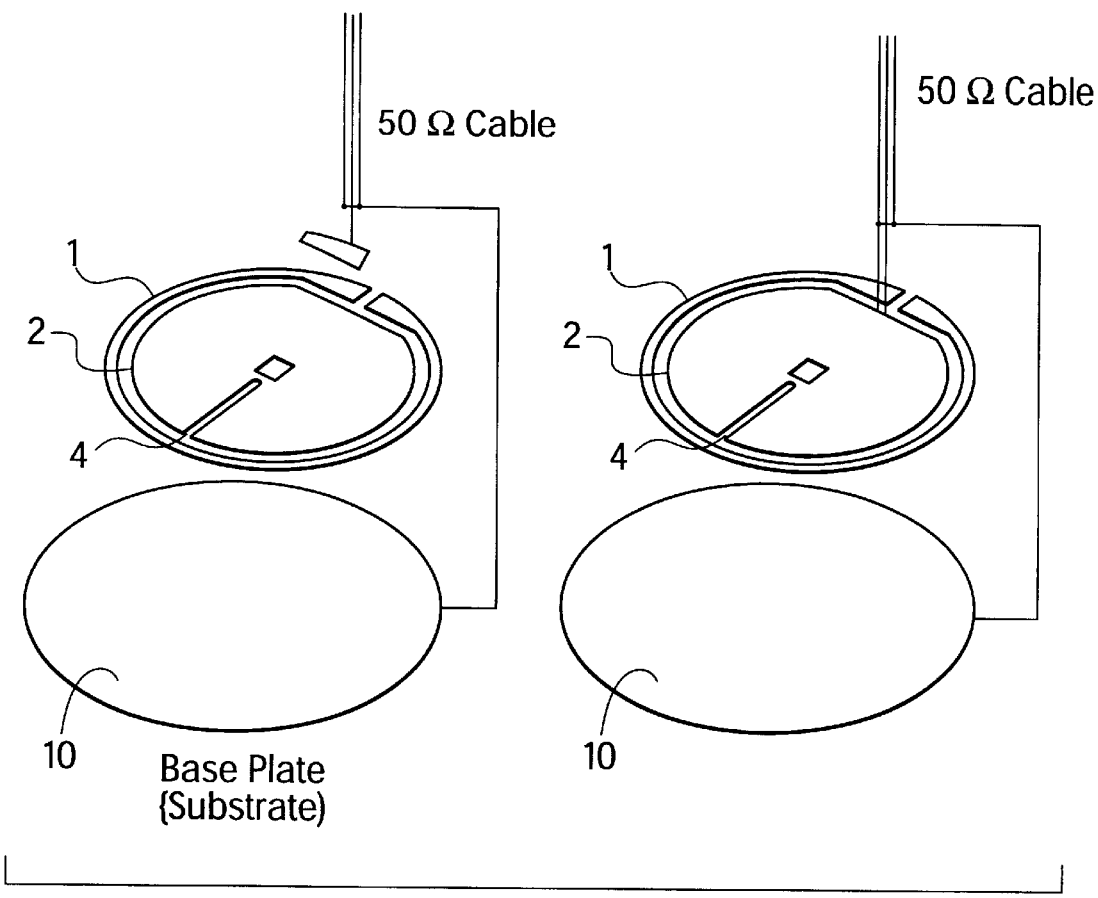
FIG. 6 is a basic representation of an rf-SQUID with a planar tank circuit and a base plate according to the embodiments specified above.
Figure 7C:
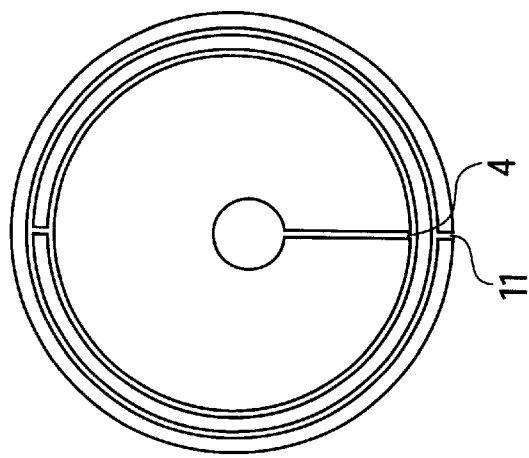
FIG. 7c is a schematic view of a third geometry of a SQUID magnetometer with a base plate designed as a coplanar loop.
Figure 7B:
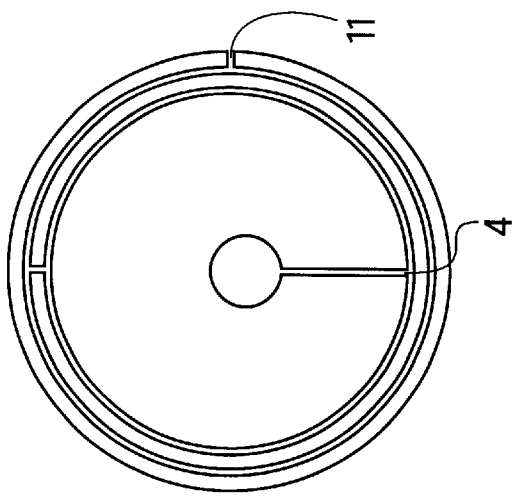
FIG. 7b is a schematic view of a second geometry of a SQUID magnetometer with a base plate designed as a coplanar loop.
Figure 7A:
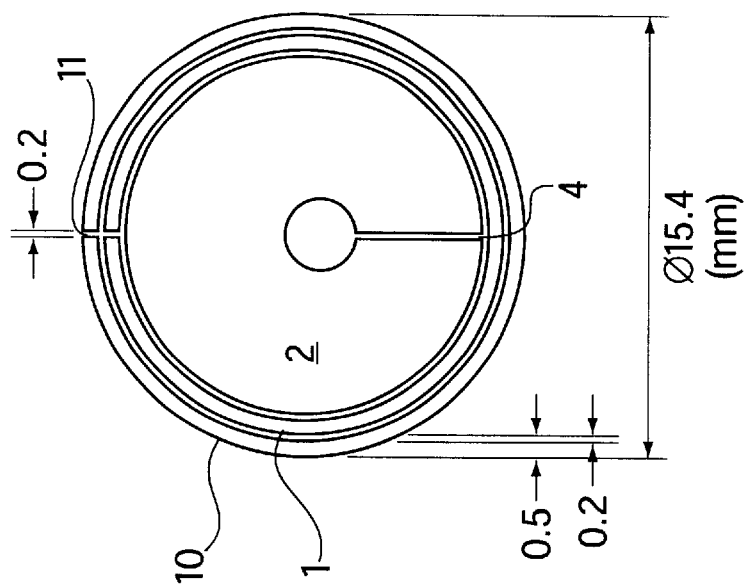
FIG. 7a is a schematic view of a first geometry of a SQUID magnetometer with a base plate designed as a coplanar loop.
Figure 8:
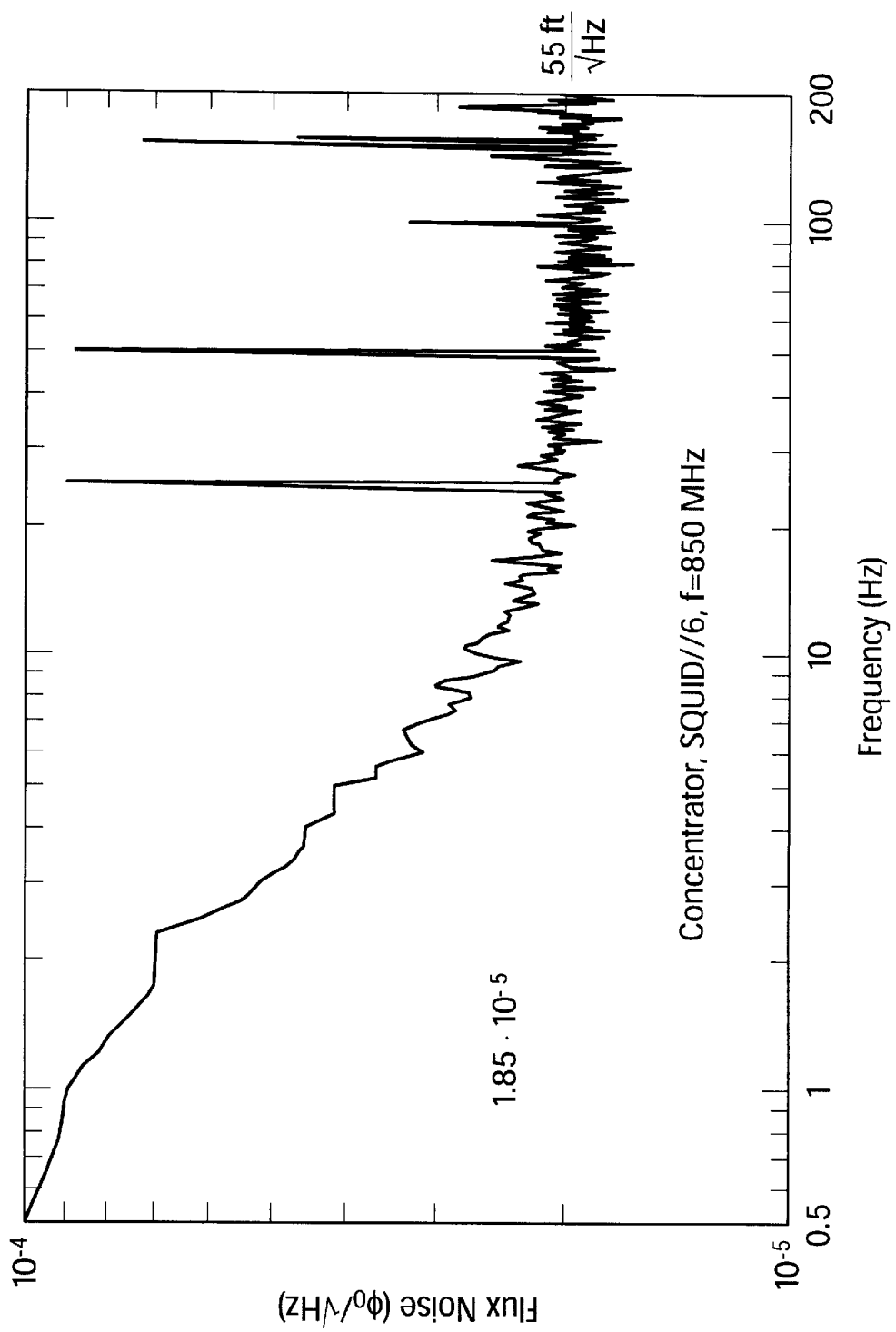

FIG. 6 shows a basic representation of an rf-SQUID 2 with a planar tank circuit 1 and a base plate 10. FIGS. 7a, 7b and 7c each show a different geometry of a SQUID-magnetometer 2 present in the arrangement with a coplanar outer loop 10a as an rf-oscillating circuit. Another outer super-conductive loop 10a is added to the SQUID-geometry in FIG. 6. Said loop 10a with a slot 11 represents the coplanar oscillating circuit. Area A in FIG. 2a can be designed as a washer, multiloop or current-injection SQUID-structure. Furthermore, it is possible to use said area as a flow concentrator or flow transformer in order to combine the coplanar oscillating circuit with a washer-SQUID magnetometer in flip-chip geometry. Test measurements with this layout showed at a resonance frequency of thw tank circuit of 850 MHz a quality of about 5000 and a white noise of $1.85 \times 10^{-5}$ $\phi_o/\sqrt{Hz}$ (FIG. 8).

A great advantage of said coplanar oscillating circuits 10a is the geometry-dependent resonance frequency of the oscillating circuit. FIGS. 7a to 7c show three different geometries. The only difference in these three representations is the orientation of slot 11 in the outer loop versus slot 4 in the inner loop.

In FIG. 7a, both slots 4, 11 are aligned one upon another, the difference in orientation comes to 0 degree. The resonance frequency amounts to $f_r$=850 MHz. If the orientation is changed to 180 degrees, the resonance frequency drops to $f_r$=550 MHz. At 90 degrees the resonance frequency comes to $f_r$=650 MHz. This provides a very simple possibility for obtaining discrete frequency ranges within a span of 300 MHz by simply changing the geometry. Such discrete frequencies are a precondition required for realizing a multi-channel HTSL-SQUID-system.

What is claimed is:

1. An arrangement for coupling an rf-SQUID magnetometer to a superconductive tank circuit (1) comprising:

a tank circuit having a circuit coil and a laminar capacitive structure which enclose the rf-SQUID magnetometer, said tank circuit consisting of superconductive thin-layer material; and an rf-SQUID magnetometer (2) containing an rf-SQUID with a washer and a multiloop structures;

wherein the tank circuit (1) and the rf-SQUID magnetometer (2) are arranged planar to each other on the same substrate.

2. The arrangement of claim 1, characterized in that the rf-SQUID magnetometer (2) contains an rf-SQUID with a current-injection structure (6).

3. The arrangement of claim 1, characterized in that the rf-SQUID magnetometer (2) contains an rf-SQUID with a single-layered or multi-layered, multi-winding transformer structure (7).

4. The arrangement of claim 1, characterized in that the rf-SQUID magnetometer (2) has an rf-SQUID with a double hole gradiometer structure having opposing coils (9).

5. The arrangement of claim 1, characterized in that the circuit (1) has a minimum resonance frequency of 400 Mhz and a minimum quality of 1000.

6. The arrangement of claim 1, characterized in that the rf-SQUID magnetometer (2) is coupled to a base plate (10).

7. The arrangement of claim 6, characterized in that the circuit coil (1a) is formed as an inner loop which encloses the rf-SQUID magnetometer (2) and has a slot (4).

8. The arrangement of claim 6, characterized in that the base plate (10) is formed as an outer loop (10a) coplanar to the rf-SQUID magnetometer (2) and the tank circuit (1) and having a slot (11).

9. The arrangement of claim 8, characterized in that the orientation of the slots (4; 11) of the inner loop (1a) and the outer loop (11) relative to each other determines the resonance frequency $f_r$.

10. The arrangement of claim 9, characterized in that an adjustment of the slots (4; 11) effects a change in the resonance frequency $f_r$ of <=300 Mhz.

* * * * *